United States Patent
Edeler

(10) Patent No.: US 6,222,416 B1
(45) Date of Patent: Apr. 24, 2001

(54) SIGNAL AMPLIFIER CIRCUIT WITH SYMMETRICAL INPUTS AND OUTPUTS

(75) Inventor: Wolfgang Edeler, Vreden (DE)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/464,247

(22) Filed: Dec. 16, 1999

(30) Foreign Application Priority Data

Dec. 16, 1998 (DE) .............................. 198 58 078

(51) Int. Cl.[7] ...................................... H03F 3/45
(52) U.S. Cl. ........................... 330/255; 330/260; 330/69
(58) Field of Search ............... 330/69, 252, 255, 330/260, 263

(56) References Cited

U.S. PATENT DOCUMENTS

| | | | |
|---|---|---|---|
| 3,639,824 | * 2/1972 | Malavasi | 330/110 |
| 3,745,477 | * 7/1973 | Freeborn | 330/110 |
| 4,086,541 | * 4/1978 | Katou et al. | 330/69 |
| 4,155,004 | * 5/1979 | Schulz | 250/201 |
| 4,321,552 | 3/1982 | Franssen et al. | |
| 4,638,260 | * 1/1987 | Hamley | 330/260 |
| 5,770,972 | * 6/1998 | Freuler et al. | 330/255 |

FOREIGN PATENT DOCUMENTS 9319522   9/1993 (WO) .

OTHER PUBLICATIONS

"Verbesserung des Gleichtakt–verhaltens von Instrumentations–verstarkern" T. Rabiger, der elerktoniker, No. 10, 1989, pp. 24–27.

"Halbleiter–Schaltungstechnik", U. Tietze et al; Springer–Verlag Berlin 1990, pp. 67 and 855.

* cited by examiner

Primary Examiner—Robert Pascal
Assistant Examiner—Patricia T. Nguyen
(74) Attorney, Agent, or Firm—Ware, Fressola, Van Der Sluys & Adolphson LLP

(57) ABSTRACT

The invention concerns an amplifier circuit for an IC whereby continuous symmetrical signal routing can be provided from the inputs to the outputs, without branches and crossovers and at low cost. The IC can be used as amplifier, buffer, line driver and line receiver with a minimum of external wiring. Two operational amplifiers (OA1) and (OA2) are each connected as non-inverting amplifiers and include integrated feedback impedances (RF1, RF2), a joint resistor (R 3) for adjusting the differential amplification, and a subtraction stage. According to the invention two complementary, parallel-connected differential amplifiers (DIF 1 and DIF 2) form the subtraction stage, each of which has its own pair of signal outputs (O 11/O 12 or O 21/O 22) for one differential signal in each case. Each of the signal outputs (O 11/O 12 or O 21/O 22) leads to its own driver (DV 11, DV 12, DV 21 and DV 22), which are interconnected so as to create a push-pull output stage in a bridge circuit.

4 Claims, 2 Drawing Sheets

SIGNAL AMPLIFIER CIRCUIT WITH SYMMETRICAL INPUTS AND OUTPUTS

BACKGROUND OF THE INVENTION

1. Technical Field

The invention concerns a signal amplifier circuit with symmetrical inputs and outputs whereby the signal is routed continuously and symmetrically from the inputs to the outputs. Such amplifiers in particular can be used as both line drivers and line receivers in symmetrical signal lines.

2. Discussion of Related Art

Telecommunications and sound studio technologies mostly use symmetrical signal paths to transmit signals through lines in order to prevent external interference signals from the environment to gain access into the useful signal. It is known that external electric and or magnetic fields in lengthy signal paths in the environment of an electronic installation, for example from its own power supply, can gain access into the useful signal as parts of superimposed external signals. Interfering signal components can also gain access into the signal paths through the power connections themselves and through thermal effects. The symmetrical routing of signals through lengthy lines between parts of the installation is always advantageous. Among other things this is also important for laying signal lines in an automobile, for example to make an intercom connection for the vehicle's driver in the front of the car with a radio telephone located in the rear of the car. As a rule such a line extends for several meters and must not be sensitive to extreme interferences from the remaining on-board electronics, such as the ignition for example.

Such connections are usually made with twisted lines. In that case only the difference in the signals between the two signal paths is processed and reproduced. All external signals which enter both signal paths capacitively or inductively by common-mode or via the power supply, are suppressed through subtraction. A measure of the quality of the symmetrical signal routing is the so-called common-mode rejection (in-phase suppression). It depends strongly on the tolerances of the respective pairs of components in both signal paths.

A so-called "electrometer subtracter" or also an "instrument amplifier" for measuring potential differences are known from the technical literature, such as for example the reference book: Semiconductor Circuit Technology/U. Tietze; Ch. Schenk—5, revised edition—Berlin, Heidelberg, New York: Springer, 1980, section 25.1.2 and illustration 25.3, and from EP 0,453,680 as well. As shown in FIG. 1, it essentially contains the three operational amplifiers OA 1 to OA 3. The operational amplifier OA 3 and the pairs of resistors R 14/R24 and R15/R25 form a subtracter with an asymmetrical signal output $O_{ASYM}$. The operational amplifiers OA 1 and OA 2 respectively form non-inverting amplifiers and are located before the inputs of the subtracter. Each non-inverting amplifier has a feedback resistor $R_F$ 1 or $R_F$ 2 between its output and the inverting input. In the interest of a high common-mode rejection, the resistors $R_F$ 1 and $R_F$ 2 as well as the pairs of resistors R14/R24 and R15/R25 must be matched as precisely as possible.

The inverting inputs of both amplifiers are interconnected by a joint resistors R 3 which is used to adjust the amplification.

It is an advantage that the resistor R 3 in both amplifiers OA 1, OA 2 can be used to adjust the joint amplification factor. Thus this resistor alone can be used to adjust the differential gain of the instrument amplifier. The additional effect of the amplifiers OA 1, OA 2 is that the instrument amplifier has two identical signal inputs, and that the parameters of the subtracter, particularly the common-mode rejection, are independent of the internal resistance of the signal source. The common-mode amplification of the non-inverting amplifiers OA 1 and OA 2 has the value of 1, regardless of the adjusted differential amplification.

It is a disadvantage that the instrument amplifier has only one asymmetrical output. This requires at least one further operational amplifier in order to also provide an inverted signal in addition to the non-inverted signal.

Another disadvantage of the known solution is that a high common-mode rejection can only be achieved when the corresponding circuit components in every branch of the circuit, including the inductive and capacitive line components of the external and internal circuit, have close tolerances. In practice this condition can only be attained with great effort since in addition to paired components with close tolerances, the signal paths also require the line routing to be symmetrical. Particularly if for example an IC (Integrated Circuit) with four integrated operational amplifiers is used in the circuit, the symmetry of the external circuit can only be approximately achieved even if it has been carefully constructed, because the signal branches are already different due to the number of active components, where different phase responses can hardly be avoided. The full circuit furthermore occupies a relatively large area of the circuit board.

It is also known to construct an instrument amplifier which includes all passive components in the form of an IC. The Maxim Integrated Products Company of Sunnyvale, Calif. already produces a pair of IC's for transmitting video or telecommunication signals via pairs of broad-band leads, which comprise a line driver IC MAX 4147 and a line receiver IC MAX 4144 or MAX 4146. The line receiver IC is, also designed as an instrument amplifier according to FIG. 1 with symmetrical differential inputs and an asymmetrical output, and contains pairs of laser-trimmed thin film resistors. In contrast thereto the line driver IC only contains two operational amplifiers connected as non-inverting amplifiers according to the two amplifiers OA 1, OA 2, the feedback resistors according to the resistors $R_F$ 1 and $R_F$ 2 and the joint resistor according to resistor R 3 in FIG. 1, but no subtracter. Therefore the signal being transmitted through the line still contains common-mode parts. These are only eliminated in the line receiver by means of the signal subtraction. In this way the common-mode parts of the signal from the line driver IC reach the line receiver IC in an unimpeded manner via the pair of lines, and are then amplified once more. In the presence of large common-mode amplitudes this can lead to over-modulation of the line receiver IC. This can be avoided by installing an additional inductive transmitter between the line driver IC and the line.

SUMMARY OF INVENTION

Starting with the indicated drawbacks, it is the object of the invention to create an integrated circuit for a symmetrical amplifier which can be manufactured with little effort due to its simple construction. Because of its technical parameters and minimum peripheral circuit, this IC is suitable as a universal module to terminate symmetrical transmission paths both as a line driver and as a line receiver, and is designed to provide high common-mode rejection without close-tolerance peripheral components.

At the signal inputs the circuit according to the invention also contains two operational amplifiers which are connected as non-inverting amplifiers and have a joint resistor for adjusting the differential amplification. Both non-inverting amplifiers have integrated feedback impedances and provide an amplified symmetrical input signal to the subsequent subtraction stage. According to the invention the subtraction stage is composed of two complementary differential amplifiers connected in parallel, each of which has its own pair of outputs for a differential signal. To suppress the common-mode signal components which are superimposed on the input signal, one differential amplifier is designed so that its operating impedances for the differential output signal are located at the positive pole of a dual voltage source, while the other contains corresponding operating impedances which are located at the negative pole of the dual voltage source. Each of the signal outputs of the differential amplifiers installed at the operating impedances is connected to its own driver, which is advantageously designed as a unity-gain amplifier (voltage follower), where the drivers are also designed to complement the type of conductivity of the series-connected differential amplifier. The signal outputs of the unity-gain amplifiers are interconnected in a way to create an output stage in the bridge circuit.

The circuit according to the invention can be fully integrated into an IC. However it is advantageous to connect the joint resistor for adjusting the differential amplification externally. The small number of required connections to the IC housing is also advantageous. Altogether only one pair of connections each are required for the operating voltage, the symmetrical inputs, the symmetrical outputs and for the joint resistor. Since the joint resistor, and possibly also HF blocking capacitors at the voltage connections, are the only peripheral components, the space requirement of the entire circuit on the board is very small. Because of the consequently symmetrical circuit construction with complementary components, the two signal paths match each other particularly well. All the paired components of the circuit are installed in the IC and the known technologies allow the tolerances to be kept small during the manufacture. This ensures a high common-mode rejection.

These and other objects, features and advantages of the present invention will become more apparent in light of the detailed description of a best mode embodiment thereof, as illustrated in the accompanying drawing.

DETAILED DESCRIPTION OF PREFERRED EMBODIMENTS

Figure 1:
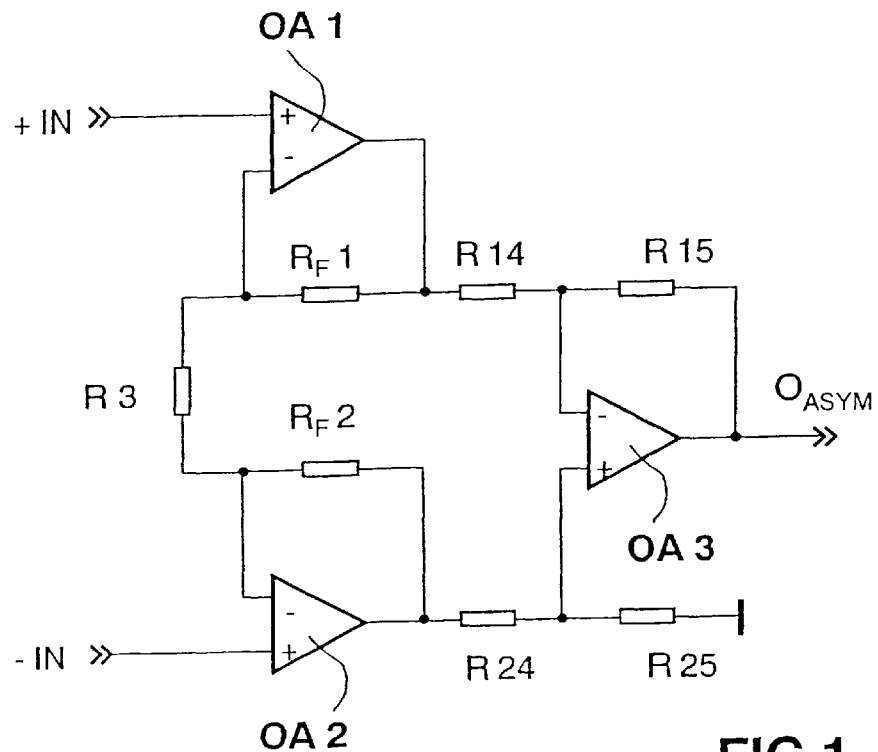
FIG. 1 a circuit diagram of a known electrometer subtracter.

As explained in the beginning, the circuit shown in FIG. 1 corresponds to the known basic circuit of an instrument amplifier.

Figure 2:
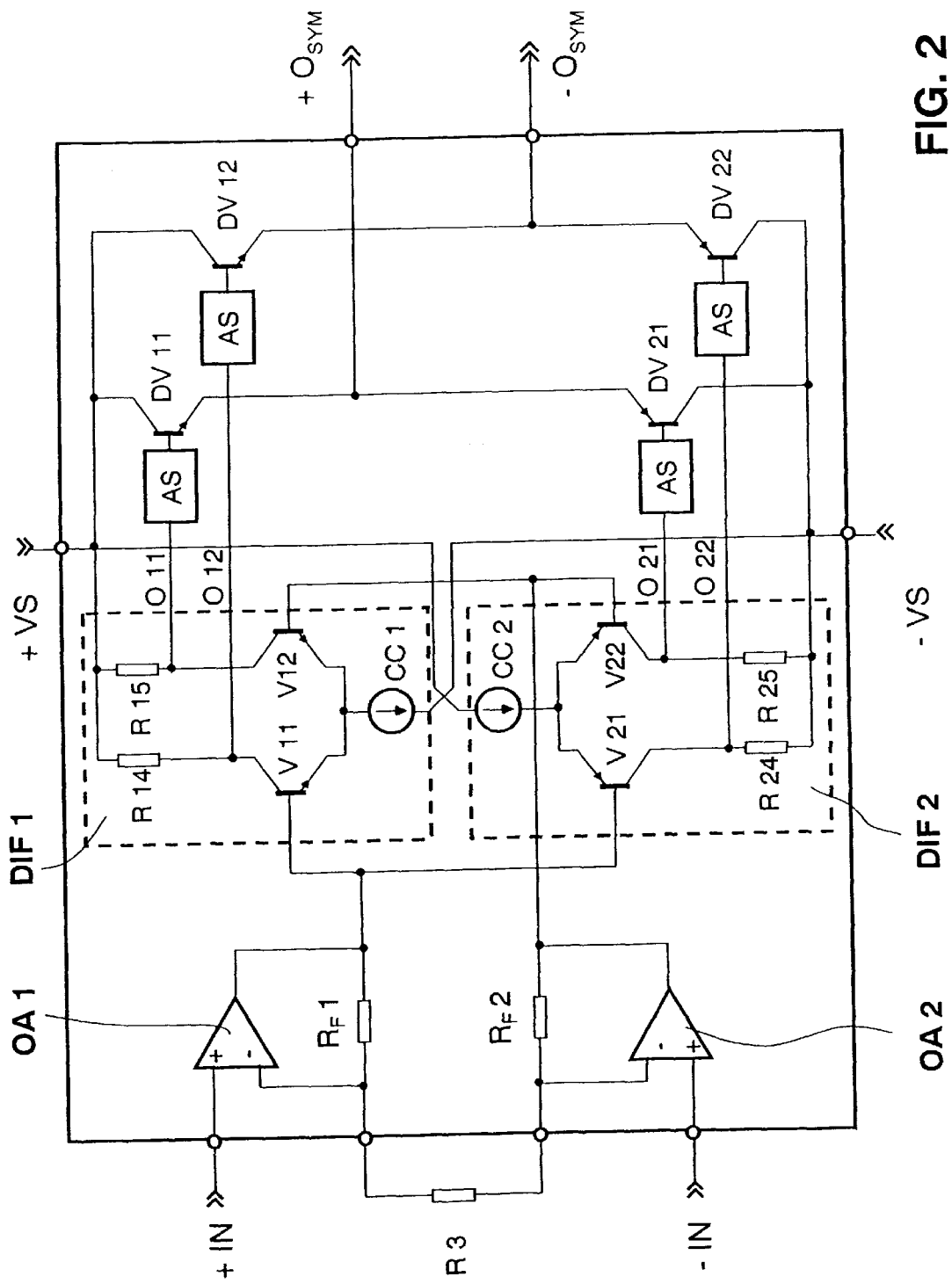
FIG. 2 a circuit diagram of the solution according to the invention.

FIG. 2 shows the basic schematic diagram according to the invention which also contains two operational amplifiers OA 1 or OA 2 with integrated feedback impedances $R_F$ 1 or $R_F$ 2 at the signal inputs +IN and −IN, and which are connected as non-inverting amplifiers. A joint resistor R 3 is used to adjust the differential amplification of the entire IC; it is either installed in the IC to provide a fixed value for the differential amplification, or it is located separately on the circuit board for adjusting an amplification in accordance with the user's requirements.

In the interest of a high common-mode rejection, the feedback impedances $R_F$ 1 and $R_F$ 2 can also be designed to have known semiconductor structures, for example with active circuit elements or voltage dividers which enable a high pairing of the signal's feedback portion with less expensive means than with integrated thin film resistors.

The non-inverting amplifiers OA 1 or OA 2 deliver an amplified symmetrical input signal with a low output resistance to the differential amplifiers DIF 1 and DIF 2. The effect of the source resistance is small due to the high energy impedances of the non-inverting amplifiers OA 1 or OA 2. The differential amplifiers DIF 1 and DIF 2 are connected in parallel with the inputs, and the transistor pairs V11/V12 and V21/V22 are designed to complement each other in semiconductor technology. To provide good symmetry in the emitter circuits, each of the two differential amplifiers contains a power source CC1 or CC2 and is powered by a dual voltage source which provides a positive operating voltage +VS and a negative operating voltage −VS. Each differential amplifier DIF 1 and DIF 2 has a pair of symmetrical outputs O11, O12 or O21, O22, each of which contains a differential signal from the amplified symmetrical input signal. The differential amplifier DIF 1 is designed so that its operating impedances R 14 and R 15 for the differential output signal are both located at the positive pole +VS of the dual voltage source. In contrast thereto, the complementary differential amplifier DIF 2 has operating impedances R 24 and R 25 which are located at the negative pole −VS. Each of the signal outputs of the differential amplifiers is connected to its own driver DV 11, DV 12, DV 21 or DV 22 which in the example are designed as unity-gain amplifiers. Because of the complementary configuration of the differential amplifiers DIF 1 and DIF 2, the symmetrical output pairs O11, O12 or O21, O22 have different d.c. voltage potentials. In the interest of a high symmetry with respect to the operating voltages +VS and −VS, this also enables the drivers DV 11, DV 12, DV 21 or DV 22 to be designed to complement the type of conductivity of the supplying differential amplifier DIF 1, DIF 2, so that the joint input/output connection of the drivers always has the corresponding operating voltage. The signal outputs of the unity-gain amplifiers are interconnected in such a way that a push-pull output stage with a symmetrical pair of outputs $+O_{SYM}$, $-O_{SYM}$ is created in a bridge circuit, which because of its low output resistance is suitable as a line driver for lines containing a high capacitive load, and can be symmetrically modulated in both polarity directions.

In principle, the circuit arrangement according to the invention can also be designed with other semiconductor technologies than with bipolar semiconductor elements. To adapt the operating points of the drivers DV 11, DV 12, DV 21, and in the interest of high modulation of the bridge output stage and low shunt currents in the push-pull branches, adapter stages AS must possibly be connected between the symmetrical output pairs O11, O12, O21, O22 and the drivers DV 11, DV 12, DV 21 and DV 22. In the simplest case each adapter stage AS contains another bipolar transistor, which forms a Darlington stage with the corresponding driver.

In the same way as the feedback impedances $R_{F\ 1}$ and $R_F$ 2, the operating impedances R 14, R 15, R 24 and R 25 can also be designed with known semiconductor structures instead of with resistors, which makes possible a high pairing of the voltage amplification in the output branches of the differential amplifiers while using inexpensive means.

The entire circuit is advantageously designed so that the operational amplifiers OA 1 or OA 2, which are connected as non-inverting amplifiers, amplify the predominant portion of the symmetrical input signal, while the differential amplifiers DIF 1 and DIF 2 only provide a small or no differential amplification, and the drivers only a current amplification.

Figure 3:
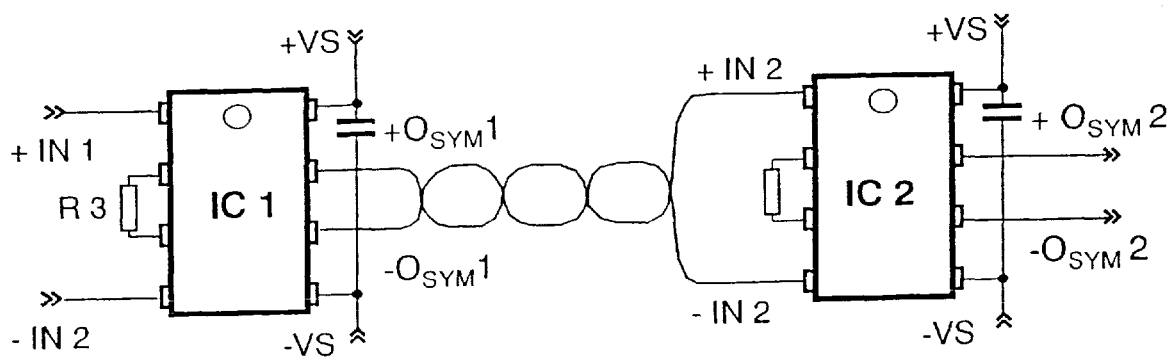
FIG. 3 a configuration of the circuit as a line driver/line receiver IC with external wiring and advantageous pin connections.

As shown in FIG. 3 a significant advantage of the circuit according to the invention is that an amplifier IC can be produced, whereby continuous symmetrical signal routing can be provided from the inputs to the outputs, without branches and crossovers and at low cost. In addition to the input and output values of the circuit, the symmetry also refers to the internal circuit components and the leads to the positive and negative operating voltage +VS or −VS, and to the pin connections of the IC. With a minimum of external wiring, the IC can be used in this way as an amplifier, buffer, line driver and as a line receiver for symmetrical signal lines.

FIG. 3 shows applications of the circuit according to the invention, whereby two identical circuits IC 1 and IC 2 are used as line driver on the one hand, and as line receiver between the twisted symmetrical dual line DL on the other. The space requirement of the entire circuit on the board is very small since the joint resistor R 3, and possibly the HF blocking capacitors C are the only peripheral components of the voltage connections +VS and −VS.

The differential amplifiers DIF 1 and DIF 2 in both IC 1 and IC 2 considerably reduce the common-mode portions of the symmetrical input signal by means of subtraction. Because of the complementary and symmetrical design of IC 1 and IC 2, and the multiplication of the common-mode rejection of the differential amplifiers DIF 1 or DIF 2, which is performed by the series connection of IC 1 and IC 2 and the continuous symmetrical line routing, the useful symmetrical signal is significantly less affected by the input of external fields and external signals than with the known line driver ICs and line receiver ICs.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

What is claimed is:

1. A signal amplifier with symmetrical inputs and outputs, two operational amplifiers (OA1) and (OA2) each of which is connected as a non-inverting amplifier with integrated feedback impedances (RF1, RF2), a joint resistor (R 3) for adjusting the differential amplification, and a subtraction stage, characterized in that the subtraction stage forms two complementary, parallel-connected differential amplifiers (DIF 1 and DIF 2), each of which contains its own pair of signal outputs (O 11/O 12 or O 21/O 22) for a differential signal, and that each of the signal outputs (O 11, O 12 or O 21, O 22) of the differential amplifiers (DIF 1 and DIF 2) leads to its own driver (DV 11, DV 12, DV 21 and DV 22), which are interconnected so as to create an output stage in a bridge circuit.

2. A signal amplifier as claimed in claim 1, characterized in that the drivers (DV 11, DV 12, DV 21 and DV 22) are designed as unity-gain amplifiers.

3. A signal amplifier as claimed in claim 2, characterized in that the drivers (DV 11, DV 12, or DV 21, DV 22) are designed to complement the conductivity of the series-connected differential amplifiers (DIF 1 or DIF 2), and form a complementary power output stage.

4. A signal amplifier as claimed in claim 1, characterized in that adapter stages (AS) are connected in series with the drivers (DV 11, DV 12, DV 21 and DV 22), which adapt the output potentials of the signal outputs (O 11, O 12 or O 21, O 22) to the input potentials of the drivers, or increase the current amplification of the drivers (DV 11, DV 12, DV 21 and DV 22).

\* \* \* \* \*